United States Patent [19]
Noda et al.

[11] Patent Number: 5,616,960
[45] Date of Patent: Apr. 1, 1997

[54] MULTILAYERED INTERCONNECTION SUBSTRATE HAVING A RESIN WALL FORMED ON SIDE SURFACES OF A CONTACT HOLE

[75] Inventors: Kazuhiro Noda, Kanagawa; Shinji Nakamura, Tokyo; Hisao Hayashi, Kanagawa, all of Japan

[73] Assignee: Sony Corporation, Tokyo, Japan

[21] Appl. No.: 271,133

[22] Filed: Jul. 6, 1994

[30] Foreign Application Priority Data

Jul. 5, 1993 [JP] Japan .................. 5-191713

[51] Int. Cl.⁶ .................................. H01L 23/58
[52] U.S. Cl. .................. 257/760; 257/759; 257/774; 257/637; 257/643
[58] Field of Search ............................ 257/753, 759, 257/760, 774, 773, 637, 643

[56] References Cited

U.S. PATENT DOCUMENTS 5,117,273  5/1992  Stark et al. .................. 257/773
5,138,424  8/1992  Moss et al. ................... 257/759
5,408,130  4/1995  Woo et al. .................... 257/758

FOREIGN PATENT DOCUMENTS 4-109655  4/1992  Japan .................. 257/760

Primary Examiner—Jerome Jackson
Assistant Examiner—Nathan K. Kelley
Attorney, Agent, or Firm—Hill, Steadman & Simpson

[57] ABSTRACT

A multilayered interconnection substrate which prevents contact failure from occurring and a process for fabricating the same, said multilayered interconnection substrate comprising a first interconnection layer formed on a substrate, at least two layers of insulation films differing in composition from each other and being formed on said first interconnection layer, provided that the insulation layers comprise at least one contact hole formed in such a manner to expose the selected portion of said first interconnection layer, a resin wall which buries the stepped portions formed on the inner peripheral portion of said contact hole, and a second interconnection layer formed inside said contact hole along said resin wall and being electrically connected to the first interconnection layer exposed at the bottom portion of the contact hole.

5 Claims, 6 Drawing Sheets

MULTILAYERED INTERCONNECTION SUBSTRATE HAVING A RESIN WALL FORMED ON SIDE SURFACES OF A CONTACT HOLE

BACKGROUND OF THE INVENTION

1. Industrial Field of the Invention

The present invention relates to a multilayered interconnection substrate and to a process for fabricating the same. More specifically, the present invention relates to fine contact structures of multilayered interconnection substrate represented by thin film transistor substrates and the like.

2. Prior Art

Referring to FIG. 6, a contact structure of a prior art multilayered interconnection substrate is explained briefly below. A lower interconnection 102 is patterned into a predetermined shape and provided on the surface of an insulation substrate 101. The surface of the lower interconnection is entirely covered by at least two layers of insulation films 103 and 104 differing from each other in composition. An upper interconnection 105 patterned into a predetermined shape is provided further thereon. An intermediate interconnection (not shown in the figure) is formed between the two layers of the insulation films 103 and 104. A contact hole 106 is formed through the two layers of the insulation films 103 and 104 to partially expose the lower interconnection 102 at the bottom of the contact hole 106. The upper interconnection 105 is electrically connected to the lower interconnection 102 via the contact hole 106 to establish the electrical connection between the interconnections.

The problems to be solved by the present invention is described briefly below. From the viewpoint of process design, the insulation film 103 is sometimes made of a material differing from that used in the insulation film 104. The two layers of insulation films 103 and 104 are locally perforated by means of, for example, wet etching, to establish the contact hole 106. To make the process simple, the two layers of insulation films 103 and 104 are continuously subjected to wet etching using a common processing solution. In the process, the etching rate for the two insulation films 103 and 104 differs according to the difference in their composition. As is shown in the figure, side etching proceeds in case the etching rate for the lower insulation film 103 is set higher than that for the upper insulation film 104. Thus, in such a case, the contact hole 106 forms in a reverse tapered shape. That is, a void 108 is produced just under the overhanging portion 107 of the upper insulation film 104. The upper interconnection 105 in a contact structure of this reverse tapered shape is apt to cause breakage at steps and the like along the void 108. This leads to the problematic generation of contact failure. The two insulation films can be prevented from being etched in a reverse tapered shape by selecting such a material having an etching rate higher than that of the lower insulation film 103 for the upper insulation film 104. However, the use of selected materials restricts the freedom in material design, and, from the viewpoint of process design, it also disadvantageously limits the selection of etching solutions. Moreover, it is practically impossible to completely prevent side-etching from occurring because the etching rate differs from time to time due to the local fluctuation in composition of the insulation films 103 and 104.

SUMMARY OF THE INVENTION

In the light of the aforementioned circumstances, the present invention aims to provide a multilayered interconnection substrate which effectively prevents contact failure such as a defect ascribed to line breakage at steps (referred to simply hereinafter as "step breakage") from occurring even when a contact hole of reverse tapered shape is formed. The object above is accomplished by a multilayered interconnection substrate which basically comprises a lower interconnection, at least two layers of insulation films differing in composition from each other, and an upper interconnection formed on the layers of insulation films. The multilayered interconnection substrate according to the present invention is characterized in that it comprises a contact hole perforated through the insulation films, and that a resin wall is provided inside the inner peripheral portion of the contact hole to fill the stepped irregularities which are formed due to, for example, side etching. The upper interconnection is led inside the contact hole along the resin wall, and electrically connected to the lower interconnection exposed at the bottom portion of the contact hole. The resin wall is made of, for example, an acrylic resin material, whereas the lower interconnection is made of a semiconductor film and the like. In general, an intermediate connection is established between the two insulation films.

The multilayered interconnection substrate having the contact structure above is fabricated by a process described below. That is, the multilayered interconnection substrate according to the present invention comprises a first step of patterning to form a lower interconnection on the substrate, a second step of sequentially depositing at least two layers differing in composition from each other on said lower interconnection, a third step of locally etching the two layers of insulation films to form a contact hole connected to the lower interconnection, a fourth step of once filling the contact hole with a resin and removing the resin thereafter from the central portion of the contact hole to shape the inner peripheral portion thereof, and a fifth step of forming an upper interconnection by patterning and electrically connecting the upper interconnection with the lower interconnection through the thus shaped contact hole. Preferably, the fourth step above comprises shaping the contact hole by partially removing the resin after filling the contact hole with a photosensitive resin and directly exposing and developing the resin.

Conclusively, the present invention comprises once filling the contact hole with a resin, and then removing the resin from the central portion of the contact hole to shape the inner peripheral portion thereof. Thus, if a step or a void should be formed in the contact hole during side etching and the like, the void can be filled by a resin having a predetermined fluidity. The inner peripheral portion of the contact hole can be covered with a step- and void-free resin wall by perpendicularly perforating the resin filled in the hole. Contact failure such as step breakage and the like can be effectively prevented from occurring by introducing the upper interconnection along the thus formed resin wall.

DETAILED DESCRIPTION OF THE PREFERRED EMBODIMENTS

The present invention is described in further detail below referring to the preferred embodiment according to the present invention. It should be understood, however, that the present invention is not to be construed as being limited to the example below.

EXAMPLE

Figure 1:
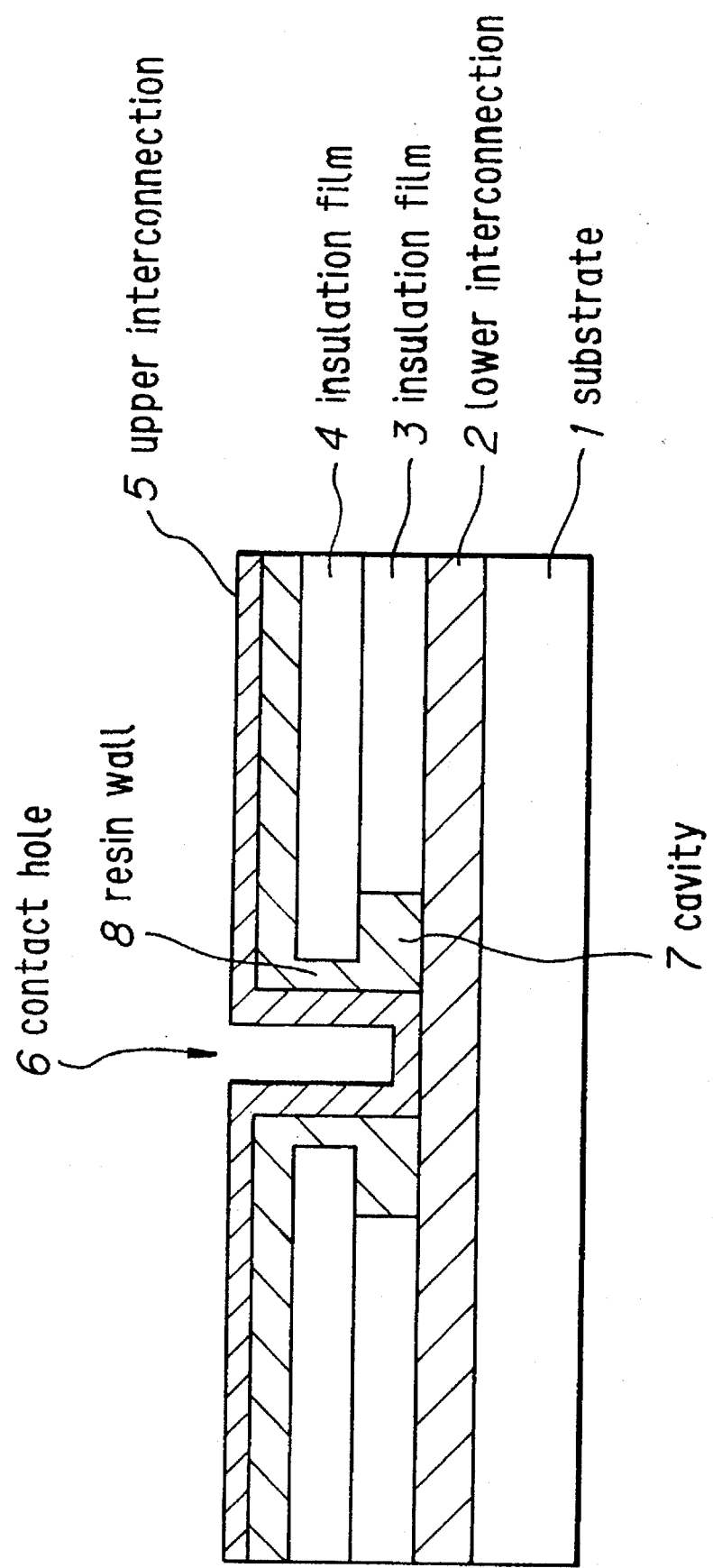
FIG. 1 shows a schematically drawn cross section view of the essential structure of a multilayered interconnection substrate according to the present invention.

FIG. 1 shows a schematically drawn cross section view of the essential structure of a multilayered interconnection substrate according to the present invention. Referring to FIG. 1, a lower interconnection 2 is formed on the surface of the insulating substrate 1 by patterning. At least two layers of insulation films 3 and 4 differing in composition from each other are globally deposited on the lower interconnection 2. In addition, an upper interconnection 5 is patterned and formed to a predetermined shape on the surface of the insulation film 4. A contact hole 6 is perforated through the multilayered structure comprising two layers of insulation films 3 and 4. In the case of the present example with reference to FIG. 1, it can be seen that side etching has proceeded to generate a void 7 due to the difference in etching rate for the upper and lower insulation layers. That is, the etching rate is higher for the lower insulation film 3 as compared with that for the upper insulation layer 4. The multilayered interconnection substrate according to the present invention comprises a resin wall 8 to provide an inner peripheral portion for the contact hole which fills the void 7 or the steps or gaps of the contact hole. The upper interconnection 5 is introduced inside the contact hole 6 along the resin wall 8, and is electrically connected to the lower interconnection 2 being exposed at the bottom of the contact hole. It can be seen easily from the figure that there is no fear of generating step breakage defects and other failures which had been conventionally known as problems, because the upper interconnection 5 do not cross over any stepped portions inside the contact hole 6.

Figure 2A:
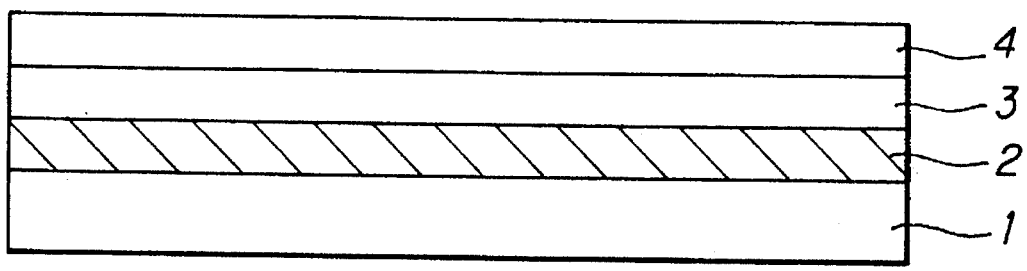
FIGS. 2A to 2C are a diagram showing schematically drawn step-sequential cross section structures obtained in a process for fabricating a multilayered interconnection substrate according to an embodiment of the present invention.

The process for fabricating a multilayered interconnection substrate according to the present invention is described in detail below referring to FIGS. 2 and 3. Referring first to FIG. 2A, a lower interconnection 2 is formed on the surface of the substrate 1 by patterning (Step 1). Then, at least two layers of insulation films 3 and 4 differing in composition from each other is formed sequentially on the lower interconnection 2. In the present example, the etching rate of the underlying insulation film 3 is higher than that for the upper insulation film 4. The insulation films combined as such set the etching rate higher for the lower insulation film had to be avoided in the prior art multilayered interconnection substrates in order to prevent side etching from occurring. In the present invention, however, this type of layered insulation films can be used without any problem.

Figure 2B:
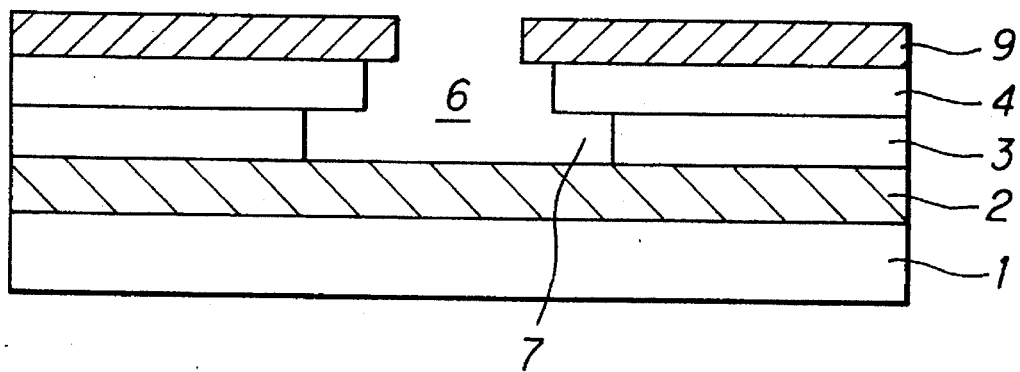
Figure 2C:
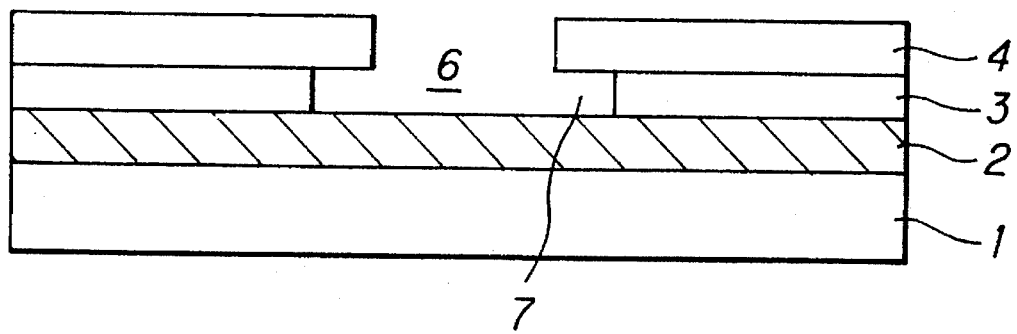

Referring to FIG. 2B, a resist 9 is applied to the surface of the insulation film 4, and locally perforated by exposure and development (Step 2). After lightly ashing, the two layers of the insulation films 3 and 4 are continuously subjected to wet etching by using the resist as the mask to form a contact hole 6 connected to the lower interconnection 2 (Step 3). Side etching proceeds to some extent on the upper insulation film 4 having a relatively low etching rate during the step 3, while causing severe side etching on the lower insulation film 3 having a relatively high etching rate. As a result, a void 7 forms just under the overhanging portion of the upper insulation film 4. Subsequently, the used resist 9 is removed by ashing as shown in FIG. 2C.

Figure 3A:
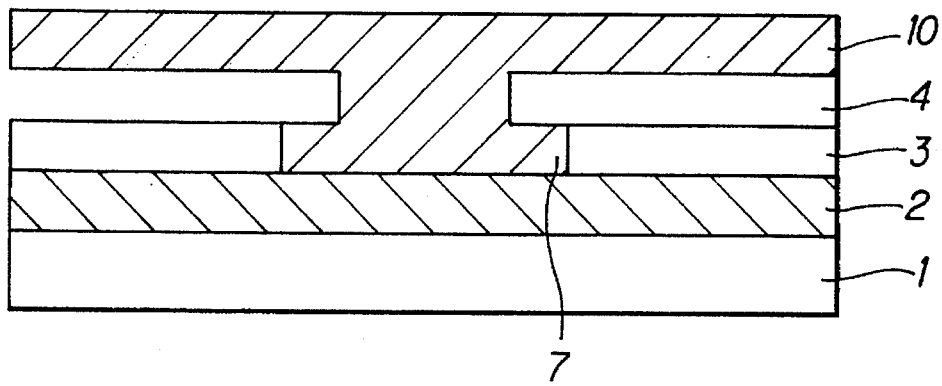
FIGS. 3A to 3C are a diagram showing schematically drawn step-sequential cross section structures obtained in another process for fabricating a multilayered interconnection substrate according to another embodiment of the present invention.

Referring to FIG. 3A, the surface of the substrate 1 having a contact hole 6 formed therein is coated with a resin 10 to fill the contact hole 6. The resin 10 used as the coating has a predetermined fluidity to fill up the void 7 according to its viscosity. The resin can be applied by means of, for example, dipping, spin coating, or printing, according to the process conditions. For rationalization of the steps subsequent to the present one, a photosensitive material is used as the resin 10. The photosensitive resin 10 is applied to the substrate 1, and then set by subjecting it to a heat treatment.

Figure 3B:
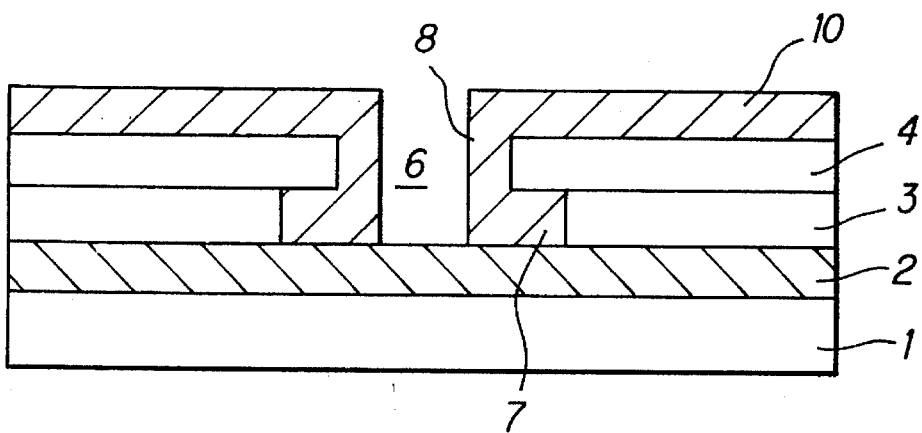
Figure 3C:
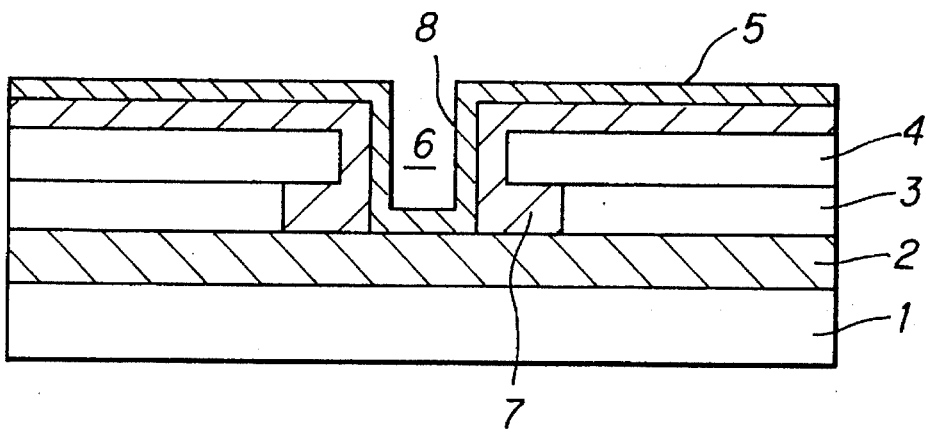

Referring to FIG. 3B, the resin 10 is removed from the central portion of the contact hole 6 to shape the inner peripheral portion of the contact hole. As a result, a resin wall 8 for filling the aforementioned void 7 or steps is formed inside the contact hole 6. The photosensitive resin 10 can be easily removed by exposing it through a predetermined mask and subjecting it to a development treatment. Finally, as shown in FIG. 3B, an upper interconnection 5 is formed by patterning, and then electrically connected to the lower interconnection 2 via the shaped contact hole 6 (Step 5).

The resin for use in shaping the contact hole must be suitable for fine processing. It must also have a sufficiently high resistance against chemicals because etching solutions and the like are used for the patterning of the upper interconnection 5. Furthermore, the resin must have a predetermined heat resistance because it may sometimes be subjected to high temperature treatment in the later steps. It is also required to be colorless and light-transmitting in case an optically transparent multilayered interconnection substrate is fabricated. Thus, a material satisfying the requirements above is selected from, for example, acrylic resin, styrene resin, polyimide, epoxy resin, silicone resin, or SOG. An SOG comprises fine-grained silicon oxide ($SiO_2$) kneaded with an organic solvent. A photosensitive resin is used in the example above to simplify the process steps. However, the process for fabricating a multilayered interconnection substrate according to the present invention is not only limited thereto, and non-photosensitive resin can be used as well. A non-photosensitive resin is free of photosensitive groups; hence, it exhibits superior light-transmitting properties and chemical stability. However, the non-photosensitive resin is inferior in processability, and it makes the fabrication process complicated. In case a non-photosensitive resin is used, an aperture is formed by exposure and development after superposing a predetermined resist on the resin coating being formed by applying and baking. The resin is selectively removed from the central portion of the contact hole through the resist by effecting dry etching, e.g., plasma etching and the like.

Figure 4A:
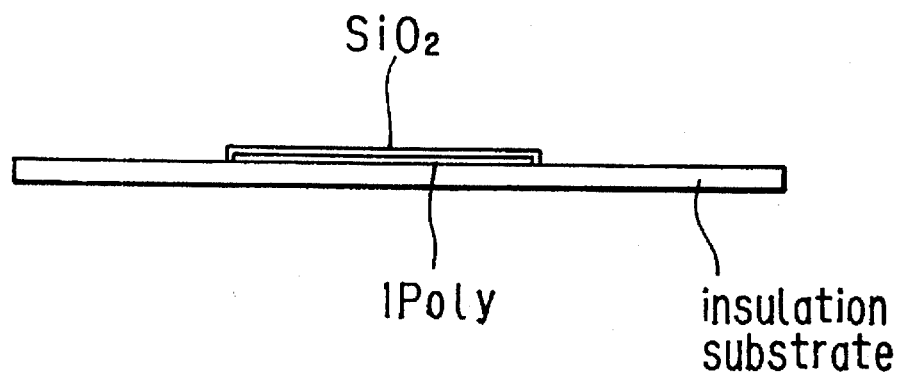
FIGS. 4A to 4C are a diagram showing schematically drawn step-sequential cross section structures obtained in a process in which the multilayered interconnection substrate according to the present invention is applied.
Figure 4B:
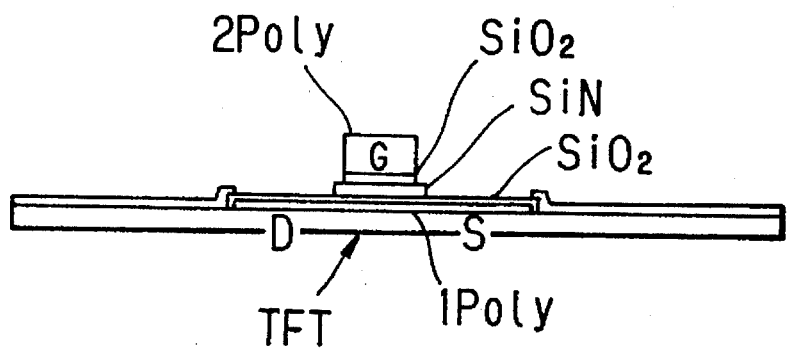
Figure 4C:
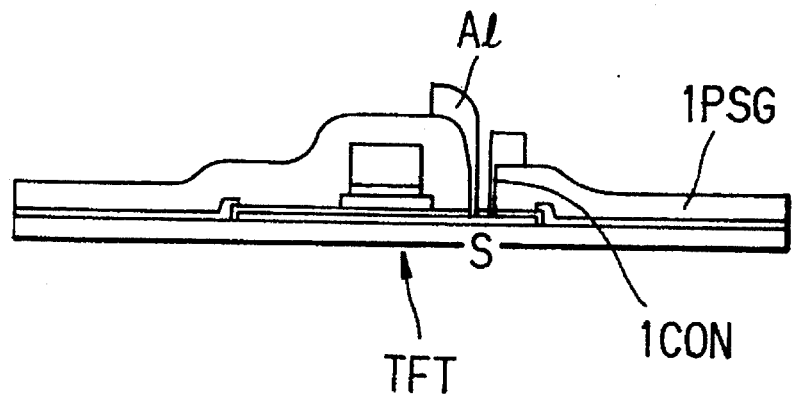

An example of an application of the present invention is described in detail below referring to FIGS. 4 and 5. An optically transparent thin film transistor substrate for use in active-matrix addressed displays is fabricated as the multilayered interconnection substrate. Referring to FIG. 4A, a thin film of polycrystalline silicon (referred to hereinafter as "1-Poly") is deposited by LPCVD process on the surface of an insulation substrate made of quartz and the like. The 1-Poly corresponds to the lower interconnection 2 shown in FIG. 1. Then, silicon (Si) ions are introduced into 1-Poly by ion implantation to provide fine-grained 1-Poly. The thus obtained fine-grained 1-Poly is further subjected to recrystallization in which the grains are allowed to undergo solid phase growth and to provide a coarse-grained 1-Poly. The 1-Poly is patterned to establish island-like portions to form the element regions. The surface of the resulting regions is thermally oxidized to obtain an $SiO_2$ gate oxide film. Boron ions are implanted at a predetermined concentration to control the threshold voltage beforehand. In the subsequent step shown in FIG. 4B, a silicon nitride (SiN) film is deposited to provide a gate nitride film. The surface of the SiN film is thermally oxidized to convert the surface into $SiO_2$. An $SiO_2/SiN/SiO_2$ three-layered structure having a high withstand voltage can be obtained as the gate insulation film. Another thin film of polycrystalline silicon (referred to hereinafter as "2-Poly") is deposited by LPCVD process thereafter. The 2-Poly thus obtained is patterned to a predetermined morphology to form a gate electrode G after lowering the resistance of the 2-Poly. The SiN film is partially removed by etching, and arsenic ions are introduced into the resulting structure by ion implantation to establish a source region S and a drain region D. Thus is an N-channel type thin film transistor (TFT) fabricated. Referring to FIG. 4C, a first inter layer insulation film (referred to hereinafter as "1-PSG") is deposited by means of LPCVD. The 1-PSG thus obtained corresponds to the insulation film 3 shown in FIG. 1. A first contact hole (referred to hereinafter as "1-CON") is formed by patterning the 1-PSG, and an aluminum (Al) film is deposited globally on the resulting structure. The Al film thus deposited is patterned into a predetermined morphology to provide a patterned metallic interconnection which is electrically connected to the source region S of the TFT.

Figure 5A:
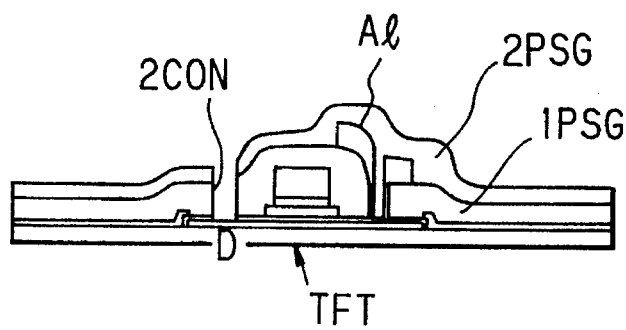
FIGS. 5A to 5D are a diagram showing schematically drawn step-sequential cross section structures obtained in a process in which the multilayered interconnection substrate according to the present invention is applied.
Figure 5B:
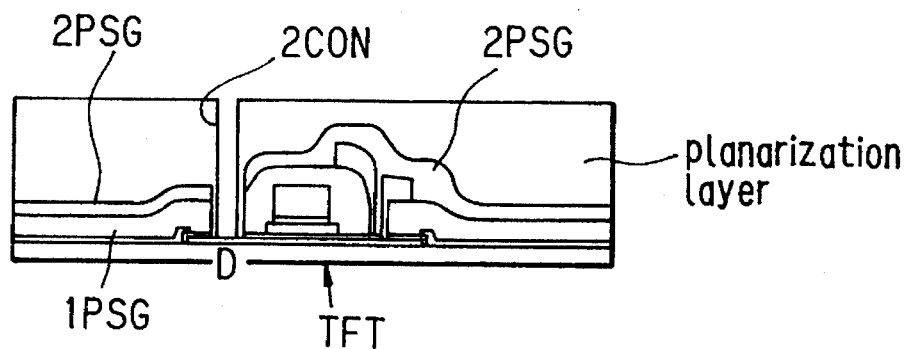
Figure 5C:
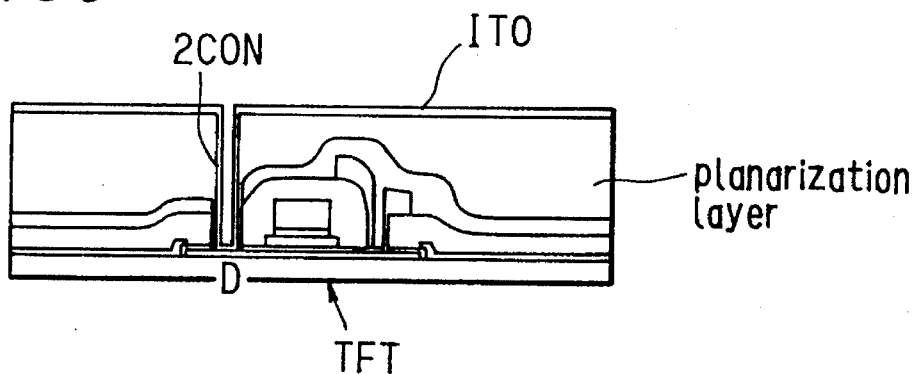
Figure 5D:
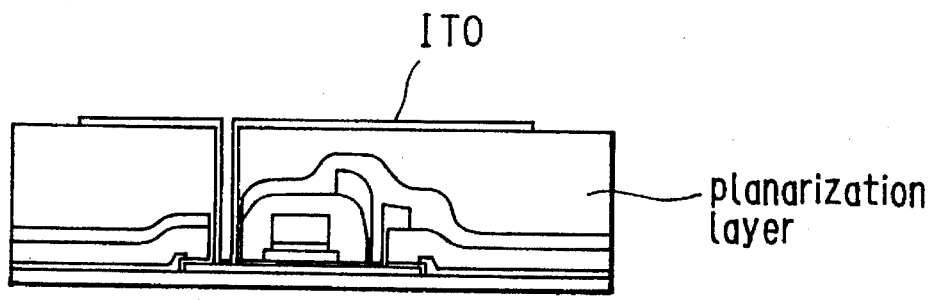
Figure 6:
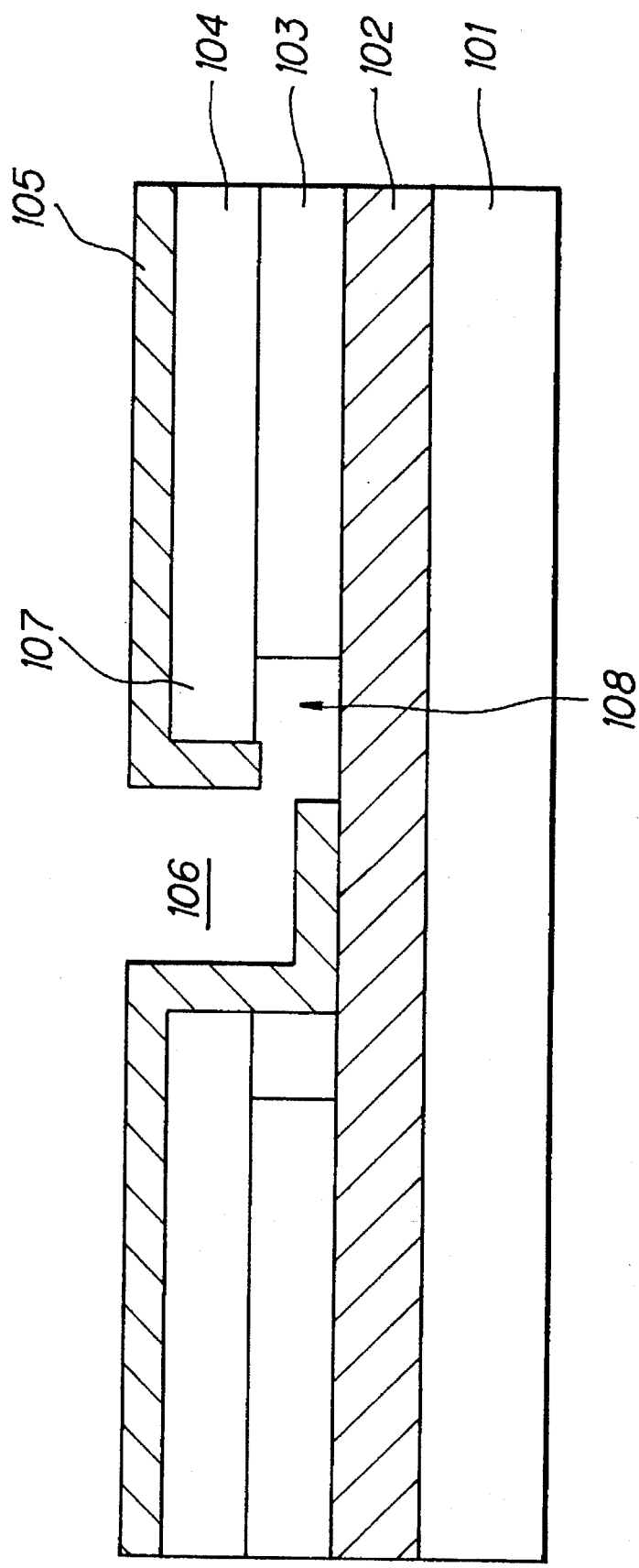
FIG. 6 shows a cross section view of a prior art multilayered interconnection substrate provided as an explanatory means.

Referring to FIG. 5A, a second insulation film (referred to hereinafter as "2-PSG") is deposited over the 1-PSG to completely cover the patterned Al metallic interconnection. The 2-PSG corresponds to the insulation film 4 shown in FIG. 1. Thus, the patterned metallic interconnection provides an intermediate interconnection interposed between two layers of insulation films. Subsequently, the layered two insulation films, 1-PSG and 2-PSG are etched continuously to perforate a second contact hole (referred to hereinafter as "2-CON") communicating with the drain region D of the TFT. The 2-CON corresponds to the contact hole 6 illustrated in FIG. 1. Side etching may occur on the 2-CON to form a contact hole of a reverse tapered shape due to the difference in composition of the 1-PSG and the 2-PSG. In the step illustrated in FIG. 5B, the surface irregularities of the 2-PSG and 2-CON are buried with a planarization layer. In this context, a liquid acrylic resin having a predetermined viscosity is applied by means of spin coating in the present example. The planarization layer corresponds to the resin 10 illustrated in FIG. 3. The planarization layer is subjected to heat treatment for setting, and the acrylic resin is selectively removed from the center portion of the 2-CON to shape the inner peripheral portion of the 2-CON. As a result, the drain region D of the TFT is found to be exposed on the bottom of the 2-CON. A clear electrically conductive film is deposited by means of sputtering in the subsequent step shown in FIG. 5C. An ITO (indium tin oxide) film is used as the clear electrically conductive film. The ITO film corresponds to the upper interconnection 5 illustrated in FIG. 1. The ITO film is deposited on the inner peripheral portion of the shaped 2-CON to establish an electric connection with the drain region D of the TFT. The ITO film is patterned thereafter into a predetermined shape to finally provide a pixel electrode as shown in FIG. 5D.

As described in detail in the foregoing, the process for fabricating a multilayered interconnection substrate according to the present invention comprises shaping the inner peripheral portion of a contact hole after once filling the contact hole and removing said resin from the central portion thereof. In this manner, the steps and voids which form in case a side etching is generated inside the contact hole can be buried with a resin to prevent contact failure, such as interconnection breakage, from occurring. Furthermore, the contact hole can be shaped even in case side etching is generated during the formation of the contact hole. Thus, the process can be designed with greater freedom without strictly controlling the process steps of the contact etching process.

While the invention has been described in detail and with reference to specific embodiments thereof, it will be apparent to one skilled in the art that various changes and modifications can be made therein without departing from the spirit and scope thereof.

What is claimed is:

1. A multilayered interconnection substrate comprising:

a first interconnection layer formed on a substrate;

first and second insulation films formed on said first interconnection layer, said first insulation film being directly formed on said first interconnection layer, said insulation films differing in composition from each other;

at least one contact hole formed in said insulation films to expose a portion of said first interconnection layer, said contact hole being larger in an area of said first insulation film;

a resin wall formed within said contact hole, said resin wall extending to sides of the first insulation film; and a second interconnection layer formed inside said contact hole along said resin wall and being electrically connected to the first interconnection layer exposed at a bottom portion of the contact hole.

2. A multilayered interconnection substrate as claimed in claim 1, wherein said resin wall is made of a material selected from the group consisting of acrylic resin, styrene resin, polyimide, epoxy resin, silicone resin, and SOG.

3. A multilayered interconnection substrate as claimed in claim 1, wherein said first interconnection layer is made of a semiconductor film.

4. A multilayered interconnection substrate as claimed in claim 1, wherein said second interconnection layer is made of a conductor film.

5. A multilayered interconnection substrate as claimed in claim 3, wherein said second interconnection layer is made of a conductor film.

\* \* \* \* \*